(12) United States Patent
Pilo

(10) Patent No.: US 12,165,738 B2
(45) Date of Patent: Dec. 10, 2024

(54) SRAM NON-CLAMPING WRITE DRIVER WITH WRITE ASSIST

(71) Applicant: Synopsys, Inc., Mountain View, CA (US)

(72) Inventor: Harold Pilo, Mountain View, CA (US)

(73) Assignee: SYNOPSYS, INC., Mountain View, CA (US)

( * ) Notice: Subject to any disclaimer, the term of this patent is extended or adjusted under 35 U.S.C. 154(b) by 166 days.

(21) Appl. No.: 18/086,423

(22) Filed: Dec. 21, 2022

(65) Prior Publication Data

US 2023/0206970 A1    Jun. 29, 2023

Related U.S. Application Data

(60) Provisional application No. 63/292,303, filed on Dec. 21, 2021.

(51) Int. Cl.
G11C 7/10    (2006.01)
G11C 7/18    (2006.01)
G11C 7/22    (2006.01)

(52) U.S. Cl.
CPC .............. *G11C 7/1096* (2013.01); *G11C 7/18* (2013.01); *G11C 7/222* (2013.01)

(58) Field of Classification Search
CPC ......... G11C 7/1096; G11C 7/18; G11C 7/222; G11C 11/417; G11C 7/1087; G11C 7/1093; G11C 11/419; G11C 8/16; G11C 2207/005; G11C 7/12
USPC .......................................... 365/189.011, 205
See application file for complete search history.

(56) References Cited

U.S. PATENT DOCUMENTS

| | | | | |
|---|---|---|---|---|
| 7,468,903 B2* | 12/2008 | Wang | .................... | G11C 11/418 365/202 |
| 7,626,871 B1* | 12/2009 | Yang | .................... | G11C 11/413 365/189.06 |
| 7,643,330 B1* | 1/2010 | Lin | ........................ | G11C 11/412 365/189.04 |
| 8,848,412 B1* | 9/2014 | Yeung | .................... | G11C 15/00 365/49.1 |
| 9,570,156 B1* | 2/2017 | Braceras | .................. | G11C 5/14 |
| 2001/0008493 A1* | 7/2001 | Takahashi | .............. | G11C 15/00 365/200 |
| 2009/0279348 A1* | 11/2009 | Hirabayashi | ........... | H10B 10/00 365/230.06 |
| 2010/0046277 A1* | 2/2010 | Behrends | .............. | G11C 11/413 365/154 |
| 2011/0019464 A1* | 1/2011 | McMullan | ............ | G11C 11/412 365/189.16 |
| 2011/0149667 A1* | 6/2011 | Hamzaoglu | ........... | G11C 11/413 365/205 |
| 2011/0157954 A1* | 6/2011 | Rimondi | ................ | G11C 11/412 365/72 |

(Continued)

*Primary Examiner* — Michael T Tran
(74) *Attorney, Agent, or Firm* — Jaquez Land Greenhaus & McFarland LLP; Bruce W. Greenhaus

(57) ABSTRACT

Various SRAM non-clamping write driver with write-assist are disclosed, including a write driver circuitry that does not clamp the Bitlines (BLs) during the write operations, and a negative BL Write-Assist (WA) circuit that provides a negative BL boost desirable for use with high-density bit cells. When used with memories other than those having high-density bit cells, the negative BL WA improves the minimum voltage (Vmin) and frequency of operation.

17 Claims, 9 Drawing Sheets

(56) References Cited

U.S. PATENT DOCUMENTS

| | | | |
|---|---|---|---|
| 2015/0357013 A1* | 12/2015 | Park | G11C 7/12 |
| | | | 365/203 |
| 2015/0380064 A1* | 12/2015 | McLaury | G11C 11/417 |
| | | | 365/154 |
| 2016/0232951 A1* | 8/2016 | Shanbhag | G11C 11/419 |
| 2019/0035455 A1* | 1/2019 | Fujiwara | H03K 19/0136 |
| 2019/0228825 A1* | 7/2019 | Hecht | G11C 11/419 |

* cited by examiner

SRAM NON-CLAMPING WRITE DRIVER WITH WRITE ASSIST

CROSS-REFERENCE TO RELATED APPLICATIONS—CLAIM OF PRIORITY

The present application claims priority to U.S. Provisional Application No. 63/292,303, filed Dec. 21, 2021, entitled "SRAM Non-Clamping Write Driver with Write Assist Option", which is herein incorporated by reference in its entirety.

BACKGROUND

(1) Technical Field

The disclosed method and apparatus relate generally to systems for write drivers. In particular, the disclosed method and apparatus relate to a static random access memory (SRAM) non-clamping write driver with a write-assist.

(2) Background

In conventional Static Random Access Memory (SRAM) designs, two complementary data signals are used to write the True and Complement Bitlines in a SRAM bit cell. Conventional driver circuits, known as write drivers, use a simple set of inverters to drive the complementary write data to the bitlines (BLs). During a bit-masking operation (in which no write occurs), both the True and Complement write data lines are driven to positive voltage (near VDD). This tends to degrade the stability margin of the bit cell and the read margin when performing two-port operations. A masking operation allows the circuit to write to only the bits of a data unit that are intended to be altered.

For memories requiring a negative BL Write-Assist (WA), additional circuitry is needed to drive the BL below VSS (i.e., ground or negative voltage power supply). Such known techniques are used to improve the yield. In some cases, the WA circuitry is incorporated into the write driver to provide the desired function. Such incorporation is typically done as a memory compile-time option.

In light of the instability created by driving both the true and complement write-data lines to a positive voltage, it would be advantageous to provide a system that does not drive both the true and complement write-data lines to positive voltages (VDD) during bit-masking operations and so does not degrade the stability margin of the bit cell or the read margin of two-port operations during bit-masking operations. Alternatively, or additionally, it would be advantageous to provide a system in which the write assist does not increase the write time or the amount of area that is required by the circuitry on a chip.

SUMMARY

Various embodiments of a method and apparatus for SRAM non-clamping write driver with write-assist option are disclosed.

In some embodiments of the disclosed method and apparatus, two features are included. The first feature is a write driver circuitry that does not clamp the Bitlines (BLs) during the write operations. The second feature is a negative BL Write-Assist (WA) circuit that provides a negative BL boost desirable for use with high-density bit cells. When used with memories other than those having high-density bit cells, the negative BL WA improves the minimum voltage (Vmin).

The disclosed write driver circuitry improves the stability margin and the read margin of one and two-port memories. The new negative BL WA circuitry can be integrated into the new write driver in some embodiments. The disclosed negative BL WA circuitry improves the negative boost level (i.e., lowers the voltage level that is applied during the negative boost operation), reduces the BL pull-down transistor size by 50% needed to attain the same write times, and so reduces the area required on chip, and reduces leakage through the pull-down circuit. The BL WA circuitry improves the discharge rate of the BL during the initial transient operation, when the BL is discharged to the negative voltage source (commonly referred to as VSS), before the boost operation.

BRIEF DESCRIPTION OF THE DRAWINGS

The disclosed method and apparatus, in accordance with one or more various embodiments, is described with reference to the following figures. The drawings are provided for purposes of illustration only and merely depict examples of some embodiments of the disclosed method and apparatus. These drawings are provided to facilitate the reader's understanding of the disclosed method and apparatus. They should not be considered to limit the breadth, scope, or applicability of the claimed invention. It should be noted that for clarity and ease of illustration these drawings are not necessarily made to scale.

The figures are not intended to be exhaustive or to limit the claimed invention to the precise form disclosed. It should be understood that the disclosed method and apparatus can be practiced with modification and alteration and that the invention should be limited only by the claims and the equivalents thereof.

DETAILED DESCRIPTION

Figure 1:
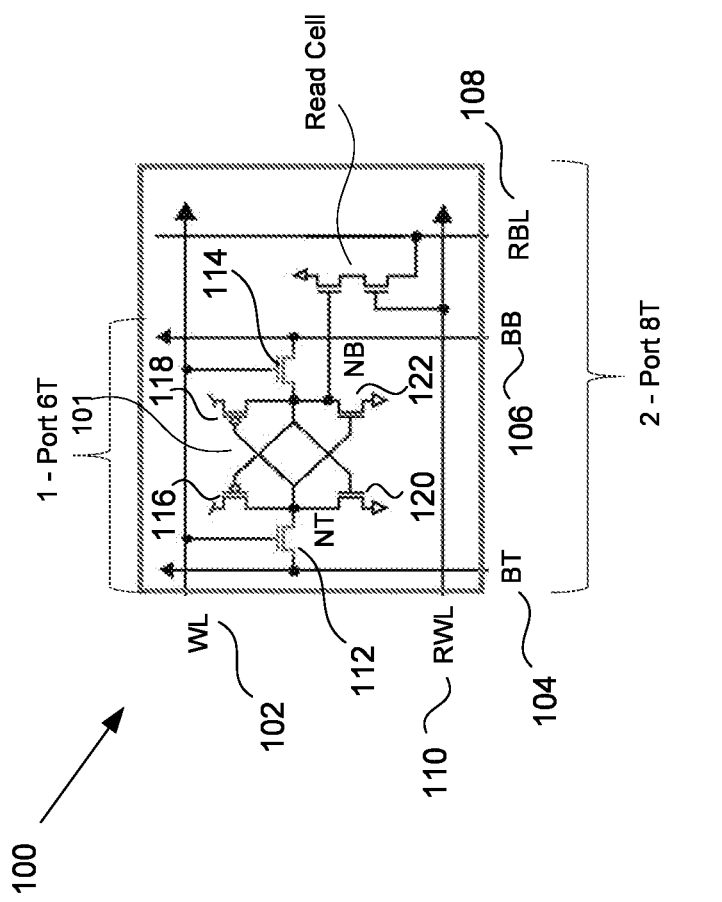
FIG. 1 is a simplified circuit diagram of one-port and two-port memory cells.

FIG. 1 is a simplified circuit diagram of a memory cell 100. The memory cell 100 is shown in both the 1-Port (6T) and 2-Port (8T) SRAM (Static Random Access Memory) configurations, where 6T refers to 6 transistors and 8T refers to 8 transistors. The reference to 1-Port or 2-Port refers to the ports of the bit cell 100. Four cross coupled transistors form a memory bit 101 that is common to both the 6T and 8T configurations. Inputs to the bit cell 100 include a Word Line (WL) 102, a bit line input, referred to hereafter as the Bit True (BT) 104, and a bit line complement, referred to hereafter as the Bar Bit (BB) 106. The outputs are a Read Bit Line (RBL) 108 and Read Word Line (RWL) 110. In addition, a fifth transistor 112 provides a switch controlled by the WL 102 to allow the input BT 104 to be applied to the memory bit 101. Similarly, a sixth transistor 114 is provided to allow the input BB 106 to access the memory bit 101.

Figure 2:
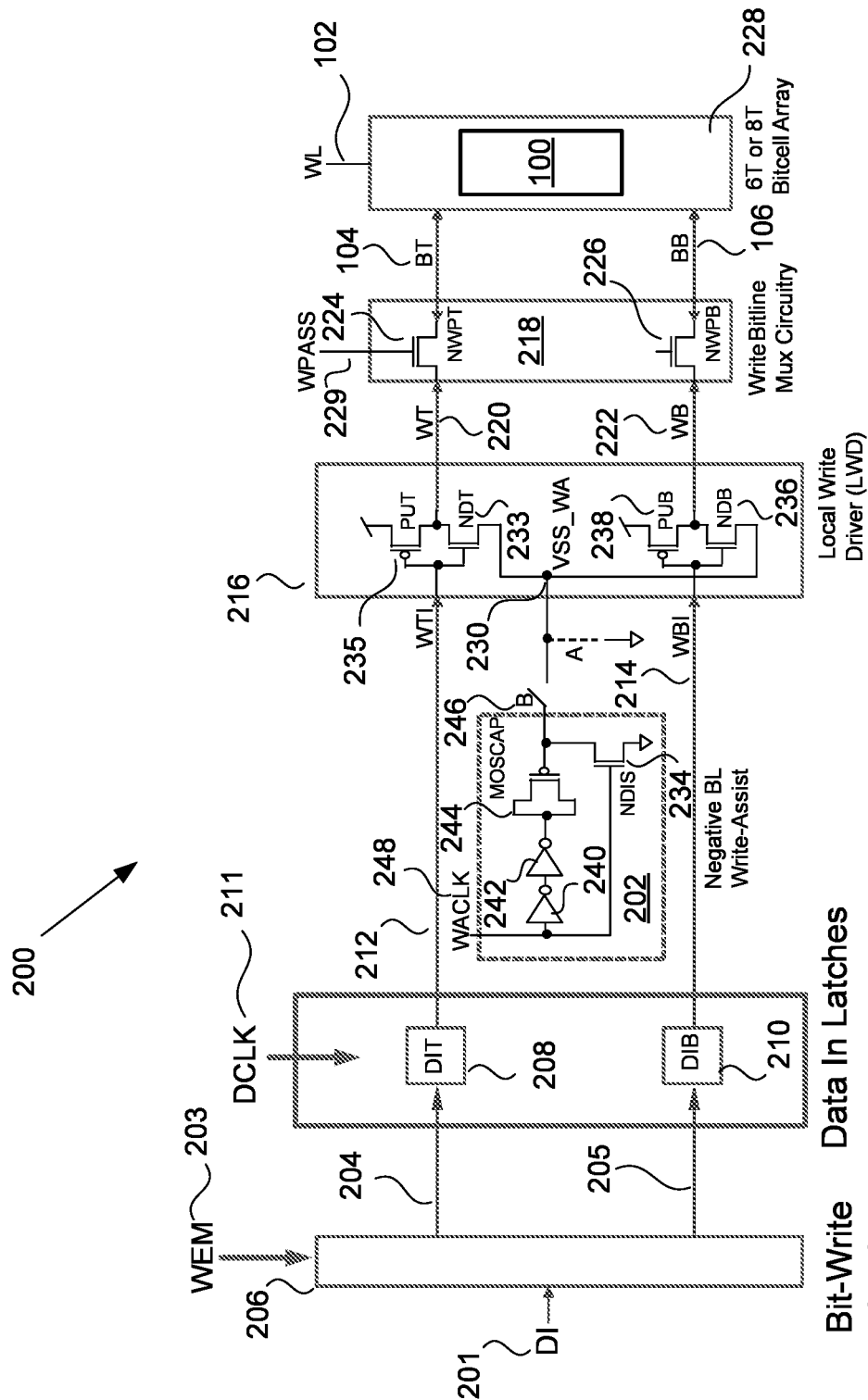
FIG. 2 is a simplified schematic of a write driver circuit coupled to the memory cell.

FIG. 2 is a simplified schematic of a write driver circuit 200 coupled to the memory cell 100 with an optional negative BL Write-Assist circuit 202. A write data signal (referred to as Data In (DI) 201) and a Write Enable Mask (WEM) signal 203 are coupled to a bit-write logic module 206. The WEM signal 203 is coupled to Input/Output (I/O) logic within the bit-write logic module 206 (I/O logic not expressly shown). The I/O logic within the bit-write logic module 206 generates a true signal 204 and a complementary signal 205 from the DI signal 201. The true signal 204 output from the bit-write logic module and is coupled to true data latch referred to as Data In True (DIT) 208. The bit-write logic module 206 also generates a complement 205 of the DI signal 201. The true signal 204 output from the bit-write logic module and is coupled to a Complement data latch referred to as Data In Bar (DIB) 210. The term "bar" indicates a logical complement. Accordingly, the DIB latches the complement of DIT in response to a data clock (DCLK) 211.

When the WEM signal 203 is in the "inactive" state (e.g., a logic "0"), the bit-write logic module 206 will set both the output that is coupled to DIT 208 and the output that is coupled to DIB 210 to zero.

The output of the DIT 208 is referred to as Write True In (WTI) 212 and the output of DIB 210 is referred to as Write Bar In (WBI) 214. WTI 212 is coupled to a bit line input to a Local Write Driver (LWD) circuit 216. The LWD 216 has four switches, each with a signal input, signal output and control input. In some embodiments are implemented as field effect transistors (FETs) in which the signal input and signal output are either the drain or source and the control input is the gate. In some embodiments, these FETs are metal oxide semiconductor FETs (MOSFETs). The WBI 214 is coupled to a bit line complement input to the LWD circuit 216. The WTI drives a first data line, referred to as write true (WT) 220 and the WBI drive a second data line, referred to as write bar (WB) 222. When WTI is in a relative high voltage state (i.e., set to a logic 1), an N-channel FET pull Down True (NDT) 233 conducts current to VSS (i.e., ground or a negative voltage) to which the source (drain) of the NDT 233 is coupled. Concurrently, a P-channel FET pull Up Bar (PUB) 235 is set to a high impedance between its source and drain. Accordingly, WT 220 is driven to a logic low level, allowing current to flow through an n-channel Write Pass Through (NWPT) FET 224 and the NDT 233 to VSS in the case in which the negative BL write-assist circuit 202 is not being used (i.e., option A shown in dotted line). Similarly, when WBI is in a relative high voltage state (i.e., set to a logic 1), an N-channel FET pull Down Bar (NDB) 236 conducts current to VSS (i.e., ground or a negative voltage) to which the source (drain) of the NDB 236 is coupled. Concurrently, a P-channel FET pull Up True (PUT) 238 is set to a high impedance between its source and drain. Accordingly, WB 222 is driven to a logic low level, allowing current to flow through an n-channel Write Pass Through (NWPB) FET 226 and the NDT 236 to VSS in the case in which the negative BL write-assist circuit 202 is not being used (i.e., option A shown in dotted line). It should be noted that when either the BT 104 or BB 106 are being pulled low, there are only two FETs between the bit cell 228 and VSS through which the current must follow (i.e., either NWPT 224 and NDT 233 for pulling BT to VSS, or NWPB 226 and NDB 236 for pulling BB to VSS).

Alternatively, when the write assist is used (i.e., option B in which NDT and NDB are coupled to the negative BL write assist circuit 202), current also must flow through negative data in signal (NDIS) n-channel field effect transistor (nFET) 234 (i.e., a third FET) to get to VSS. The write assist operation is described in greater detail below.

The BLs, WT 220 and WB 222, are coupled to inputs to a write BL multiplexer circuitry 218. More particularly, the WT 220 is coupled to the input of a Write Pass True (NWPT) device 224 and the WB 222 is coupled to the input of a Write Pass Bar (NWPB) device 226. The NWPT and NWPB devices 224, 226 control the BLs 104, 106, which write into a bit cell 228, such as the bit cell 100 of FIG. 1. A high impedance path is established by turning off NWPT 224 and FWPB 226 (i.e., applying a relatively low voltage signal to WPASS 229).

In some embodiments, write assist is provided by the negative BL write assist circuit 202. A negative voltage source is coupled to a point 230 in the LWD 216 through the NDIS 234. The voltage source is referred to as VSS_WA, where VSS is a common reference used to refer to a negative voltage source. The negative bit line write assist circuit 202 (hereafter referred to simply as the write assist (WA) circuit 202) has a delay device, implemented in some embodiments by two inverters 240, 242 that are coupled in series. The delay device is coupled to a capacitive device. In some embodiments, the capacitive device is implemented as a Metal Oxide Semiconductor Capacitor (MOSCAP) 244. The MOSCAP 224 is coupled to ground through NDIS 234 and to a switch 246 that couples the WA circuit 202 to the LWD 216. The switch allows the WA circuit to be provided as an option. In embodiments in which the WA circuit is always used, the switch 246 is not required.

Figure 3:
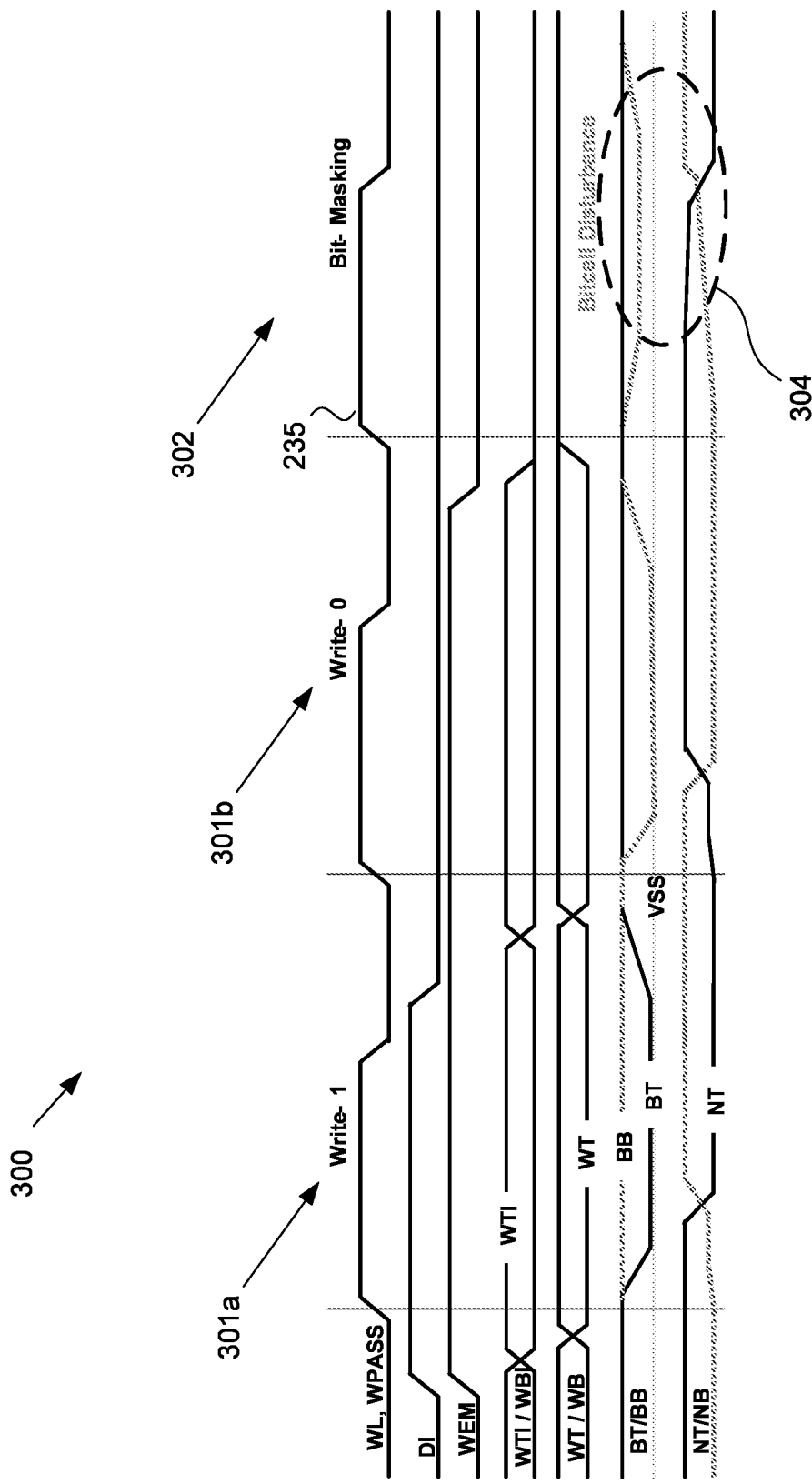
FIG. 3 illustrates a prior art waveform diagram without a write assist for the circuit of FIG. 2.

FIG. 3 is an illustration of a timing diagram 300 for the circuits shown in FIG. 1 and FIG. 2. The bit cell 100 is not expressly shown in the write driver circuit 200 for simplicity, but nonetheless present within the bit cell 228 of the write driver circuit 200. The timing diagram 300 shows the waveforms that occur during a write operation 301 and a bit-masking operation 302 of the write driver circuit 200. It should be noted that when multiple elements are shown in the drawings with reference designations having both alphabetic and numeric characters, each having the same numeric characters, but different alphabetic characters, such as 301*a* and 301*b*, the elements independent, but are essentially the same. Such elements can be referenced collectively by referring to numeric characters alone. For example, the first write operation 301*a* and the second write operation 301*b* can be referred to collectively as write operations 301.

The bit-masking operation 302 results in a potential disturbance (shown within the dotted circuit 304). This disturbance is due to BT 104 and BB 106 being clamped while the Word Line (WL) 237 and WPASS are asserted (e.g., set to a high logic state). That is, during the mask operation 302, WEM 203 is set to the inactive state (relative low voltage logic zero). When in the inactive state, WEM 203 causes WTI 212 and WBI 214 to be set low. With both WTI 212 and WBI 214 low, the LWD 216 drives both WT 220 and WB 222 high. Referring to FIG. 1, with WL 102 asserted, the high voltage of BT 104 and BB 106 attempt to make both NT and NB high. However, the cross coupling of the pull-ups and pull-downs at the core of the bit cell 100 fight any change to the state of the bit cell 100. That is, with BT 104 and BB 106 both high and WL 102 active, the pull-ups 116, 118 and the pull-downs 120, 122 can lose the state of the bit cell. In addition to the first problem of the disturbance 304 discussed above, a second problem is presented by drawbacks in the write assist circuit 202.

Figure 4:
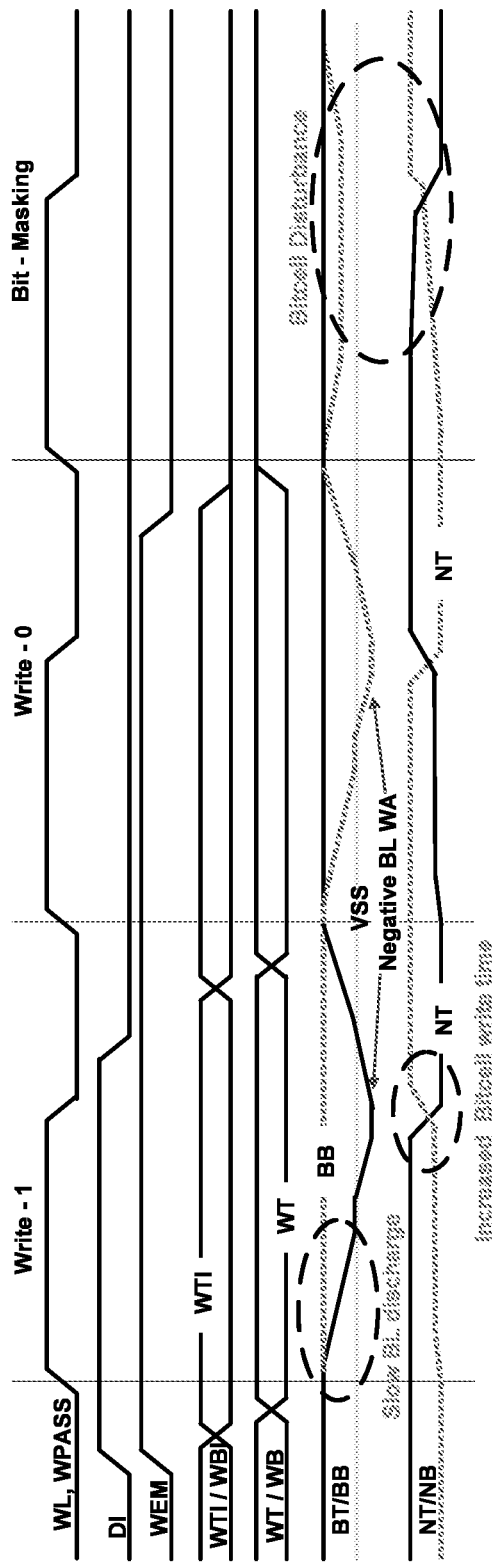
FIG. 4 illustrates a prior art waveform diagram with WA for the circuit of FIG. 2.

FIG. 4 is an illustration of a timing diagram showing the operation, including the write and bit-masking operations for a circuit in which the WA option is used (i.e., when the WA circuit 202 is present (see FIG. 2)). The WA circuit 202 provides assistance in driving the bit cell 100 to the desired state when a state change is being written to the bit cell 100. Referring again to FIG. 1, when WL 102 is active, BT is high and BB is low, the bit cell is latched to the state in which NT is high and NB is low. Once placed in that state, the bit cell 100 will resist changes to this state, since the pull-up 116 is conducting, the pull-down 120 is not conducting, and the pull-down 122 is conducting with the pull-up 118 off. To change the state of the bit cell 100, NT and NB have to overcome these pull-ups and pull-downs. The WA circuit 202 provides additional drive to assist in overcoming the resistance to a state change. This drive is applied for a short time and then removed.

The WA circuit 202 operates by pulling either BT 104 or BB 106 (whichever is to be set low) below VSS after complete discharge to VSS. This is done using a WA Boost capacitor 244, which is a Metal Oxide Semiconductor Capacitor (MOSCAP). A write assist clock (WACLK) 248 and two inverters 240, 242 coupled in series allow either WT 220 or WB 222 to achieve VSS (or close to it) before applying the WACLK to the MOSCAP 244. While only two inverters 240, 242 are shown, as many as are required to ensure that the voltage at the gate of the MOSCAP 244 is near VSS before dropping the voltage at the source/drain of the MOSCAP 244. This ensures effective driving of the gate voltage of the MOSCAP 244 below VSS. For example, if BT is being set low and BB high, then the WA circuit 202 pulls the BT line to below VSS immediately upon the WACLK hitting the source/drain of the MOSCAP 244. Shortly thereafter, the voltage at the source/drain of the MOSCAP returns to VSS. By pulling the BT line below VSS, this drive is applied to NT through the FET 112 ensuring that the pull-up 118 turns on and the pull-down 122 turns off. This in turn will allow the pull-down 120 to turn on and the pull-up 116 to turn off.

The use of the WA circuit 202 is effective in ensuring that the bit cell flips more aggressively once the WACLK signal reaches the MOSCAP 244. However, it can be seen that the discharge slew of BT 104 (or BB 106) increases because of the addition of NDIS 234 in the discharge path. The increased slew increases the write time, resulting in an increase in the cycle time.

Accordingly, it can be seen that the discharge path for either BT 104 or BB 106 to VSS is through a series of three nFETs. For discharge of BT 104, these three nFETs are the NWPT 224, NDT 233 within the LWD 216 and NDIS 234 within the WA circuit 202. The addition of NDIS 234 in the discharge path slows the discharge of both BT 104 and BB 106. One way that this has been addressed is to increase the size of these three FETs. However, the increased size increases the amount of area required for the overall device. The slower BL discharge impacts the cycle time, and leakage.

Figure 5:
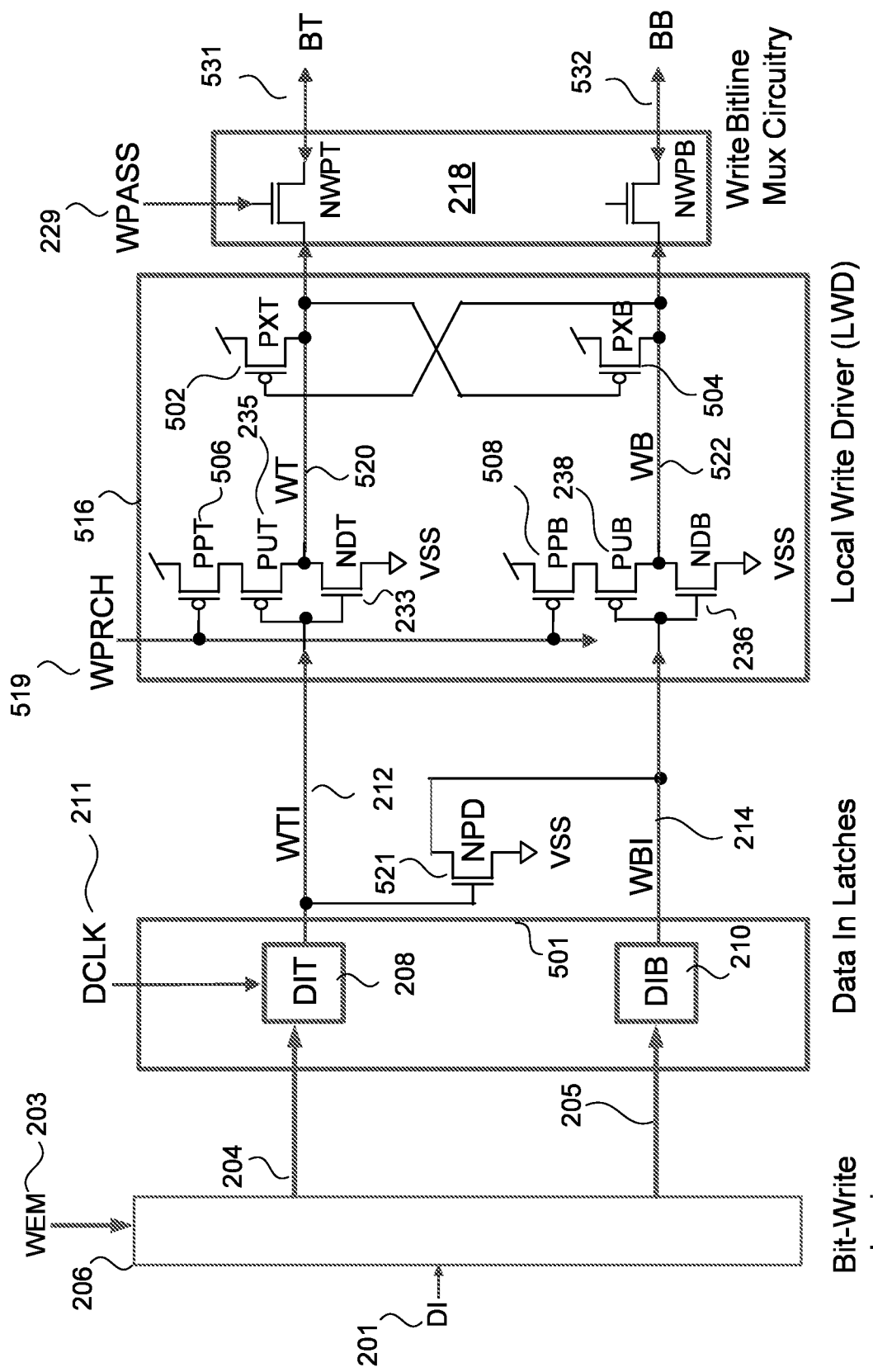
FIG. 5 illustrates a schematic of an embodiment of the non-clamping write driver (LWD) with no write assist.

FIG. 5 shows the schematic of an embodiment of a write driver circuit 500 having a non-clamping LWD 516 with no write assist. The LWD 516 has eight switches, which in some embodiments are implemented as FETs, and in some such embodiments, as MOSFETs. This embodiment deals with the first problem (i.e., the disturbance 304 shown in FIG. 3).

In the write driver circuit 500, the BWL 206, the data in latches 208, 210 and the write BL multiplexer circuitry 218 are essentially the same as described above with regard to the write driver circuit 200 shown in FIG. 2. The bit cell 100 shown in FIG. 1 is coupled to BT 531 and BB 532, similar to BT 104 and BB 106 as shown in FIG. 2.

In the write driver circuit 500, the following elements are provided: (1) a Write True (WT) p-channel cross couple true device (PXT) 502 cross-coupled to a Write Bar (WB) p-channel cross-couple bar device (PXB) 504; (2) a p-channel pull-up true (PPT) FET 506; (3) a p-channel pull-up bar (PPB) FET 508, an nFET pull-down (NPD) 510.

In the LWD 516, the drain (or source) of PPT 506 is coupled to source (drain) of the PUT 235. Similarly, the drain (or source) of the PPB 508 is coupled to the source (drain) of the PUB 238. The gates of the PPT 506 and PPB 508 are coupled to a write precharge port to which a write precharge signal (WPRCH) 519 is applied. WPRCH 519 follows the WL 102 and WPASS 229 logic. That is, when the WL 102 and WPASS 229 are high, WPRCH 519 is high as well. When the WL 102 and WPASS 229 are low, the WPRCH 519 is low as well. The PXT 502 and PXB 504 are cross-coupled to provide stability to the state of WT 520 and WB 522 when WPRCH 519 is inactive (i.e., when the pull-up is removed from WT 520 and WB 522).

An n-channel pull down (NPD) 521 is coupled between the output of the DIT 208 and the output of the DIB 210. The gate of the NPD 521 is coupled to one or the other of WTI 212 and WBI 214 to ensure that both outputs are not at a high voltage state at the same time. In the embodiment shown, the gate of the NPD 521 is coupled to the output of the DTI 208 and the source (or drain) is coupled to the output of the DIB 210. The drain (or source) is coupled to VSS (i.e., ground or a negative voltage source). The drain and source are essentially interchangeable for this purpose. In other embodiments, the gate of the NPD 521 may be coupled to the output of the DIB 210 and the source or drain is coupled to the output of the DIT 208.

Figure 6:
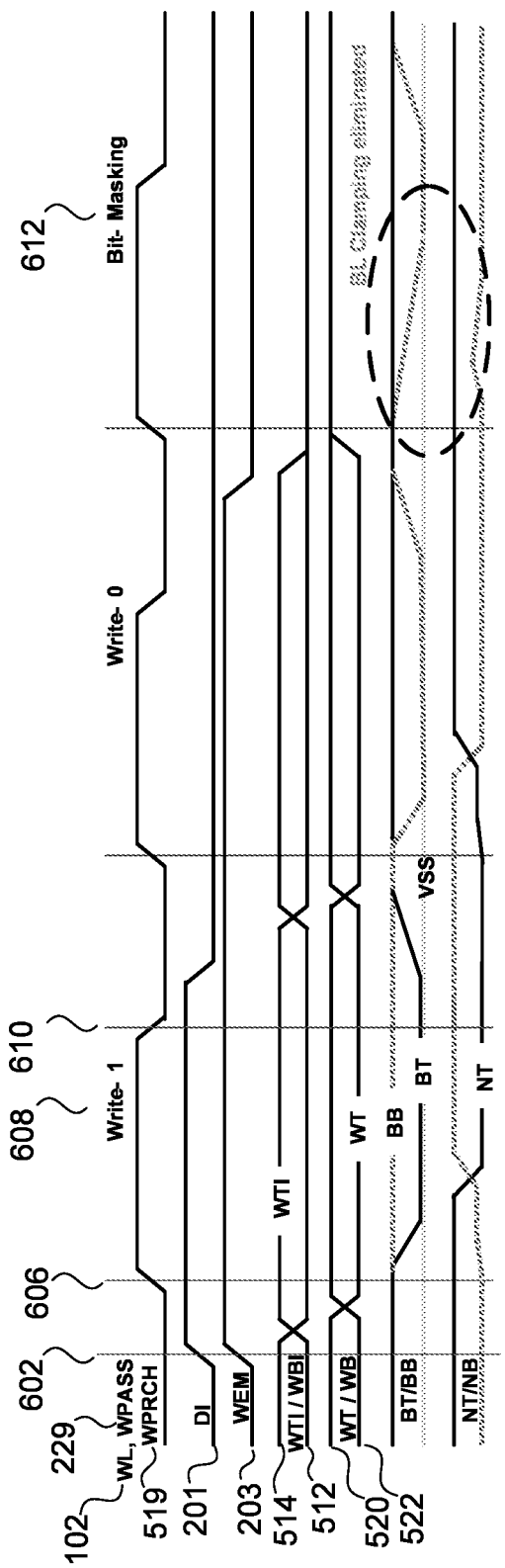
FIG. 6 illustrates the waveform diagram of the embodiment of FIG. 5.

FIG. 6 is a timing diagram showing the waveform corresponding to the write driver circuit 500.

When WL 102 and WPASS 229 are low, WPRCH 519 is low as well. With WPRCH 519 low, PPT 506 and PPB 508 both conduct (enable PUT 235 and PUB 238 to pull up WT 520 and WB 522). Initially, WEM 203 is low, which causes WTI 212 and WBI 214 to be low. Accordingly, PUT 235 and PUB 238 will each pull up WT 520 and WB 522, respectively. At a point 602, WEM 203 transitions to an active state with WL 102, WPASS 229 and WPRCH 519 still low. With WEM 203 active, WT 520 and WB 522 are driven to "0" or "1" depending on the state of DI 201. With WPRCH 519 still low, WT 520 and WB 522 are driven to their respective logic states by the combination of PPT 506, PUT 235, NDT 233, PPB 508, PUB 238 and NDB 236. The cross-coupled PXT 502 and PXB 504 will then hold this state as, WPRCH 519 transitions at a point 606 to an active state, together with WL 102 and WPASS 229. Activation of WPRCH 519 shuts off the pull-up path through PPT 506 and PPB 508. However, for the write state (e.g., Write-1 608), the PXB keeps the WB clamped to the "1" state while WT discharges BL. At a point 610, the active portion of the write-1 operation is complete and WL 102, WPASS 229 and WPRCH 519 transition to a low in preparation for the next operation. DI 201 can then transition to the next state to be written in preparation for the next write operation.

If the next operation is a bit masking operation 612, WEM 203 transitions to an inactive state prior to the operation. In response, WTI 212 and WBI 214 are set to low. WT 520 and WB 522 are then precharged to VDD (near supply voltage level). The LWD 216 has a positive input voltage supply port to which VDD is applied. A negative power supply port is also provided to which VSS is applied. When the bit masking operation begins, WL 102, WPASS 229 and WPRCH 519 are set to high. With WPRCH 519 high, the pull up (clamping) is removed from WT 520 and WB 522. WT 520 and WB 522 are left floating at the precharged VDD level for the Bit-masking operation. During a Bit-masking operation, the bitcell discharges both NT and NB through the FETs 120 and 122 of the bit cell. Since there is no clamping, both drop to VDD minus Vt, the threshold voltage.

In some embodiments, NPD 510 is provided. During the power-up condition, NPD 510 prevents WTI and WBI from having a high value simultaneously. If the DCLK signal is active as power is applied to the latch circuits of the DIT 208 and DIB 210, both DIT 208 and DIB 210 can output a signal at VDD. This is undesirable because with both WT and WB at near VSS, a significant current will flow through the cross-coupled PXT 502 and PXB 504. As long as either DIT 208 or DIB 210 output a signal at VSS (a low logic level), the circuit will perform as desired. The NPD 501 ensures that if the output of the DIT 208 is near VDD (i.e., the high voltage supply level), then the output of the DIB 210 will be pulled low to near VSS (i.e., the low voltage supply level).

Figure 7:
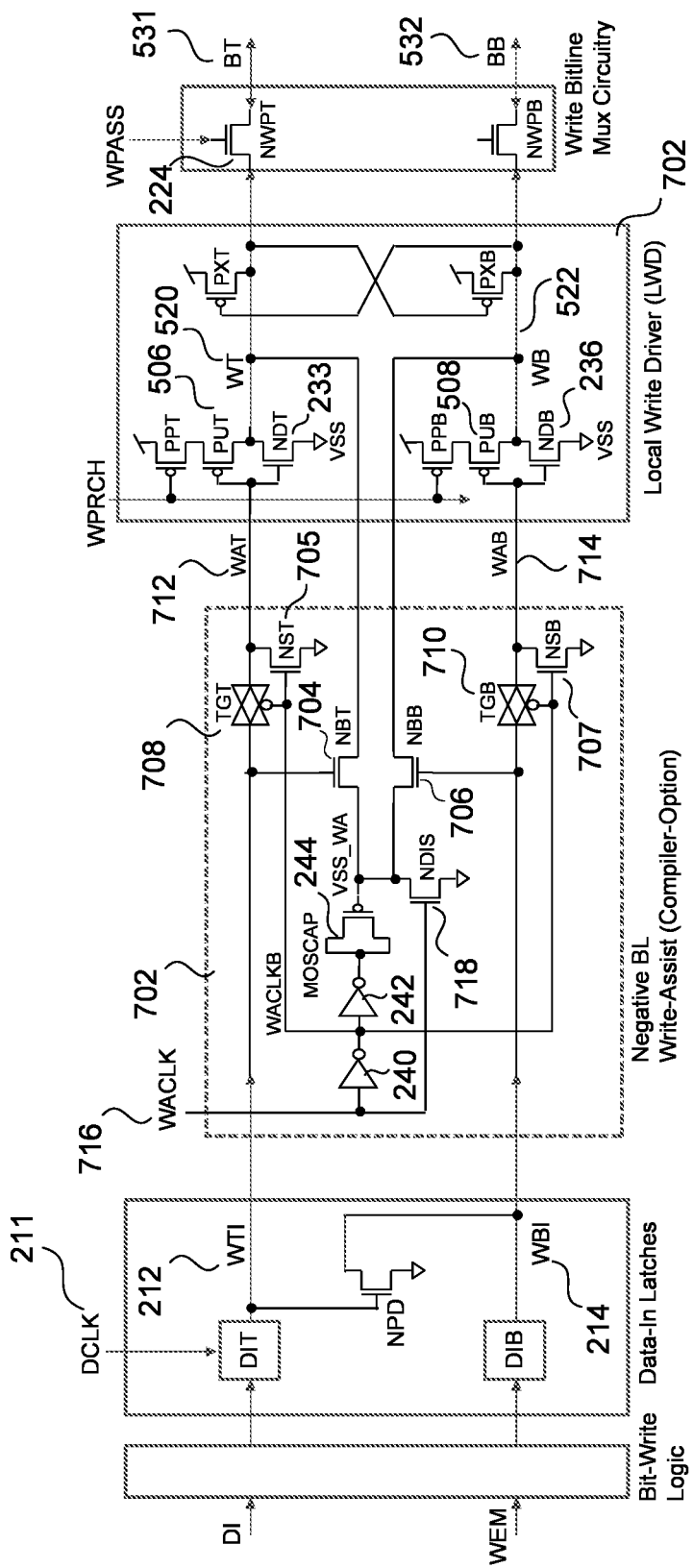
FIG. 7 illustrates a schematic of an embodiment for the non-clamping write driver (LWD).

FIG. 7 shows the schematic of an embodiment for the non-clamping LWD 702 with a WA Option. The WA circuit 702 provides write assist without the disadvantage of adding an additional FET through which discharge current for WT 520 and WB 522 need to flow when transitioning the line to VSS during a write operation.

The WA circuit 702 comprises: (1) inverters 240, 242, (2) MOSCAP 244 (which may be implemented as a FET with the drain and source coupled together), (3) four NFETs, NFET BT (NBT) 704, NFET BB (NBB) 706, NFET Signal true (NST) 705 and NFET Signal Bar (NSB) 707, and (4) two transmission gates, transmission gate true (TGT) 708 and transmission gate bar (TGB) 710. In some embodiments, the WA circuit 702 also has a write assist clock port to which a wire assist clock (WACLK) signal 716 is applied. Some embodiments of the WA circuit 702 also has a write input port to which the WTI 212 is applied, and a write complement input port to which WBI 214 is applied.

The inverters 240, 242 and the MOSCAP 244 are similar that shown in the write driver circuit 200. However, the output of the MOSCAP 244 is coupled to the source (drain) of NBT 704 and NBB 706. The drain (source) of NBT 704 is coupled to WT 520. Similarly, the drain (source) of NBB 706 is coupled to WB 522. The gate of NBT 704 is coupled to WTI 212. The gate of NBB 706 is coupled to WBI 214.

The output of TGT 708 is a signal referred to as Write Assist True (WAT) 712. In some embodiments, the WAT 712 is output through a write assist output port. WAT 712 is coupled to the gates of PUT 506 and NDT 233 to generate WT 520. The output of TGB 710 is a signal referred to as Write Assist Bar (WAB) 714. In some embodiments, the WAB 714 is output through a write assist complement output port. WAB 714 is coupled to the gates of PPB 508 and NDB 236 to generate WB 522. A write assist clock signal WACLK 716 is coupled to the input of the inverter 240, to the gate of NDIS 718. The source (drain) of NDIS 718 is coupled to VSS and the drain (source) is coupled to the output of the MOSCAP 244. The output of the inverter 240 is coupled to the input of the inverter 242, the gate of NST 705, the gate of NSB 707, the control input to TGT 708 and the control input to TGB 710. The source (drain) of NST 705 is coupled to VSS and the drain (source) is coupled to the output of the TGT 708. The source (drain) of NSB 707 is coupled to VSS and the drain (source) is coupled to the output of the TGB 710.

Figure 8:
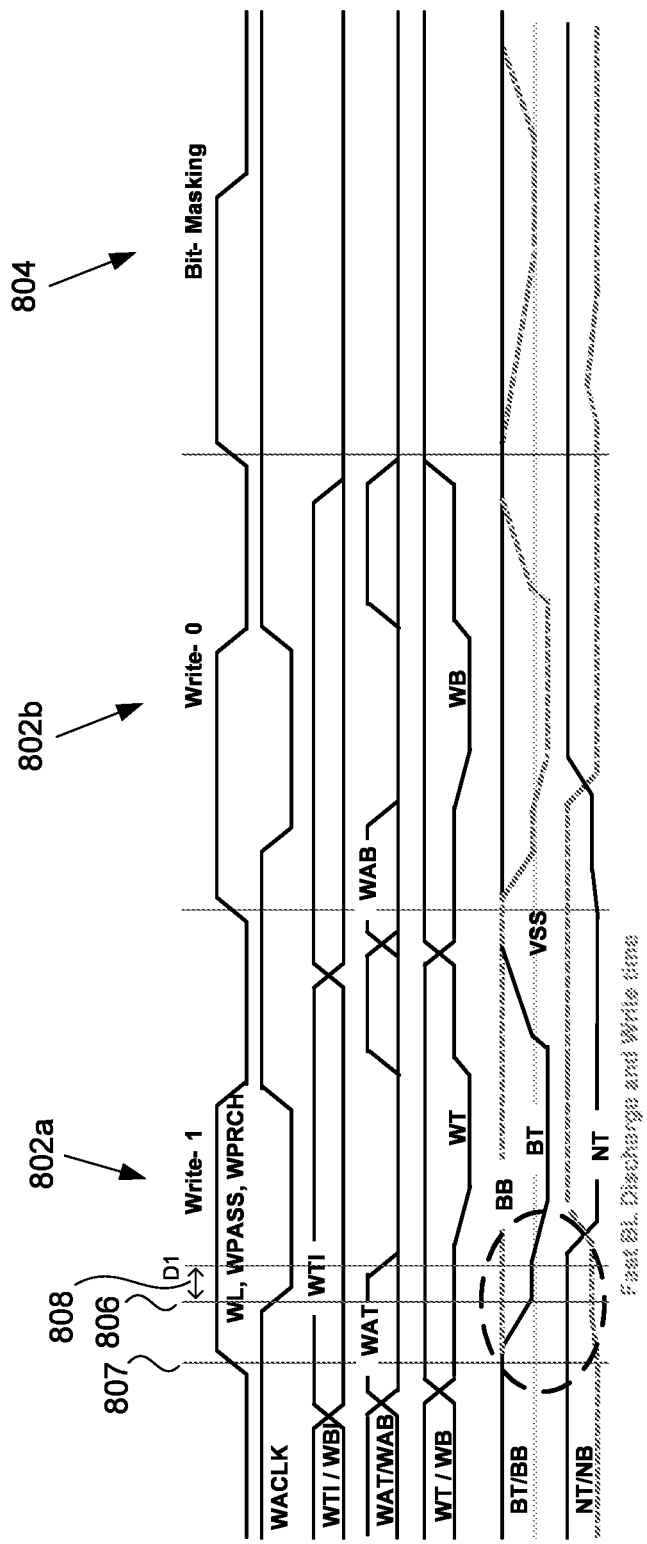
FIG. 8 illustrates the waveform diagram of the embodiment of FIG. 7.

FIG. 8 shows the corresponding waveform diagram showing two write operations 802 and a bit-masking operation 804. At the beginning of the write operation 802, WL 102, WPASS 229 and WPRCH 519 transition to a high state. Looking at the first write operation 802a in which DI 201 is high (not shown in the timing diagram of FIG. 8), WTI 212 goes high and WBI 214 goes low. In the first portion of the write operation 802, the WACLK 716 is high. Therefore, TGT 708 and TGB 710 are conducting. Accordingly, WAT 712 is high and WAB 714 is low. NST 705 and NSB 707 are both off. Therefore, the cross-coupled PXT 502 and PXB 504 latch a low and a high, respectively. A conduction path through NWPT 224 and NDT 233 allows BT 531 to reach VSS. It should be noted that WT 520 would have been brought to low prior to PPB 508 being turned off by the transition of WPRCH 519 (see the discussion above regarding WEM 203 being set prior 602 to the beginning of the write operation 608). However, WPASS 229 would have been inactive, so NWPT 224 would not have been conducting yet. Nonetheless, BT 531 starts dropping toward VSS as soon as the write operation begins. A delay in the transition of WACLK 716 and the delays provided by the inverters 240, 242 ensure that BT 531 reaches VSS (or very near) before the negative boost occurs. The negative boost provided by the MOSCAP 244 pulls BT 531 below VSS.

A relatively short time 806 after the start 807 of the write operation 802, WACLK 716 transitions low to initiate the boost operation (i.e., apply write assist). The transition to a low by WACLK turns off NDIS 718. A short time later, as determined by the delay through the first inverter 240, NST 705 and NSB 707 turn on (i.e., start conducting). When NST 705 and NSB 707 turn on, causing NDT 233 and NDB 236 turn off. Concurrently, the two transmission gates TGT 708, TGB 710 stop conducting. After another short delay as the WACLK signal propagates through the inverter 242, the low transition is coupled to the input (drain/source) of the MOSCAP 244 to generate the desired negative boost. Depending on which of WTI 212 or WBI 214 is high, either NBT 704 turns on (i.e., conducts) or NBB 706 turns on to conduct the negative boost to WT 520 or WB 522. In some embodiments, the output provided by NBT 704 is provided through a write output port and the output provided by NBB 706 is provided through a write complement output port.

Prior to the negative boost, BT 531 discharges through NWPT 224 and NDT 233, which is the same as occurs in the write driver circuit 500 in which there is no WA circuit. Accordingly, the BL discharge slew rate is the same and the effective write window remains the same. The boost can then be applied sooner and the write operation completed faster than without the boost. Thus, there is a cycle time improvement over the write driver 200 using write assist.

The transmission gates 708, 710 allow the data latches, DIT 208, DIB 210, to be disconnected from the LWD 516 when the write assist is being implemented, as will be described in more detail below. NFETs NBT/NBB provide paths through which a negative boost voltage (VSS_WA) can be applied WT 520 and WB 522. During a boost operation (i.e., when write assist is being applied), inputs to the LWD 702 (i.e., the WAT 704 and the WAB 706) are reset low through NST 705 and NSB 707, respectively, to the prevent boost voltage, VSS_WA from draining to VSS through NDT 233 or NDB 236. The WPRCH signal is also leveraged to shut off the PPT/PPB and isolate the VDD path from the negatively boosted WT or WB. Since NDIS is no longer in the discharge path of BL, its size is significantly reduced. Unlike the prior art, the BL discharge path is kept to two NFETs, allowing a 50% reduction in size and a faster BL discharge rate.

Figure 9:
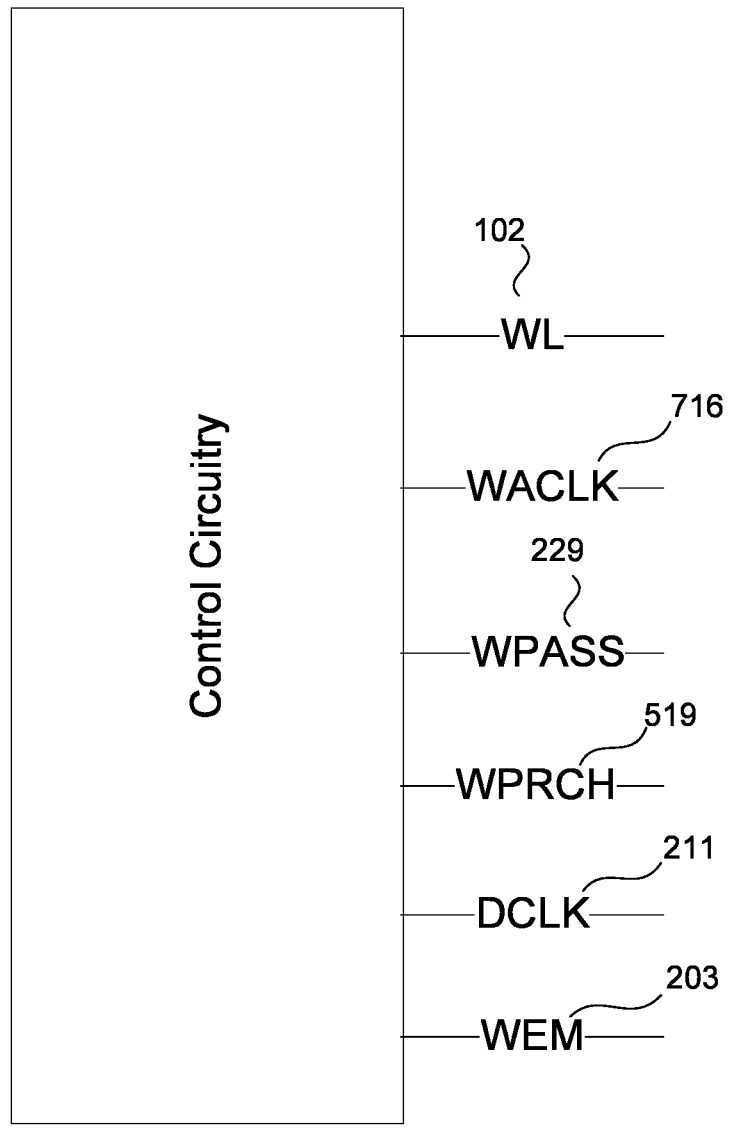
FIG. 9 illustrates control circuitry having signal outputs for outputting the following signals: WL, DCLK, WPASS, WPRCH, WACLK and WEM in accordance with the timing requirements of the write driver and indicated in the timing diagrams.

FIG. 9 illustrates control circuitry having signal outputs for outputting the WL 102, DCLK 211, WPASS 229, WPRCH 519, WACLK 716 and WEM 203 in accordance with the timing requirements of the write driver and indicated in the timing diagrams.

Although the disclosed method and apparatus is described above in terms of various examples of embodiments and implementations, it should be understood that the particular features, aspects and functionality described in one or more of the individual embodiments are not limited in their applicability to the particular embodiment with which they are described. Thus, the breadth and scope of the claimed invention should not be limited by any of the examples provided in describing the above disclosed embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide examples of instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

A group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the disclosed method and apparatus may be described or claimed in the singular, the plural is contemplated to be within the scope thereof unless limitation to the singular is explicitly stated.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described with the aid of block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A write driver comprising:
   a) local write driver (LWD) having:
      i) a write precharge input port;
      ii) a positive input voltage supply port;
      iii) a negative input voltage supply port;
      iv) eight switches, each having a control input, a signal output and a signal input,
         i) the signal output of a first of the eight switches coupled to the signal input of a second of the eight switches and the control input of the first of the eight switches coupled to the control input of the second of the eight switches;
         ii) the signal output of a third of the eight switches coupled to the signal input of a fourth of the eight switches and the control input of the third of the eight switches coupled to the control input of the fourth of the eight switches;
         iii) the control input of a fifth of the eight switches coupled to the write precharge input port, the signal input of the fifth of the eight switches coupled to a positive voltage supply and the signal output coupled to the signal input of the first of the eight switches;
         iv) the control input of a sixth of the eight switches coupled to the write precharge input port, the signal input of the fifth of the eight switches coupled to the positive voltage supply port and the signal output coupled to the signal input of the third of the eight switches;
         v) the signal input of the seventh of the eight switches coupled to the positive power supply port, the signal output of the seventh of the eight switches coupled to the signal output of the second of the eight switches and the control input of the seventh of the eight switches coupled to the;
         vi) the signal input of the eighth of the eight switches coupled to the positive power supply port, the signal output of the eighth of the eight switches coupled to the signal output of the fourth of the eight switches and to the control input of the seventh of the eight switches and the control input of the eighth of the eight switches coupled to the output of the seventh switch; and
         vii) the signal output of the third of the eight switches and the signal output of the sixth of the eight switches each coupled to the negative power supply port;
      v) a bit line output port coupled to the signal output of the seventh of the eight switches and to the bit line input of the bit cell;
      vi) a bit line complement output port coupled to the signal output of the eighth of the eight switches and to the bit line complement of the bit cell;
      vii) a write input port coupled to the control input of the first of the eight switches; and
      viii) a write complement input port coupled to the control input of the third of the eight switches.

2. The write driver of claim 1, wherein the eight switches are field effect transistors (FETs).

3. The write driver of claim 1, wherein the FETs are metal oxide semiconductor FETs (MOSFETs).

4. The write driver of claim 1, wherein the first, third fifth, sixth, seventh and eighth switches are p-channel metal oxide semiconductor field effect transistors (MOSFETs).

5. The write driver of claim 4, wherein the second and fourth switches are n-channel MOSFETs.

6. The write driver of claim 1, wherein the bit cell comprises:
   a) Six three-port switches, each having a control input, signal input and signal output,
      i) the signal input of a first of the six switches coupled to the positive supply port;
      ii) the signal output of the first of the six switches coupled to: (1) the signal input of a second of the six switches; (2) the control input of a third of the six switches; (3) the signal output of a fourth of the six switches; and (4) control input of a fifth of the six switches;
      iii) the signal input of the third of a six switches coupled to the positive supply port;
      iv) the signal output of the third of the six switches coupled to: (1) signal input of the fifth of the six switches; (2) the control input of the first of the six switches; (3) the control input of the second of the six switches; and (4) the signal output of the sixth of the six switches;
      v) the signal output of the fifth of the six switches and the signal output of the second of the six switches each coupled to a negative power supply;
   b) a word line port coupled to the control input of the fourth of the six switches and the control input of the sixth of the six switches;
   c) a bit line port coupled to the signal input of the fourth switch of the six switches; and
   d) a bit line complement port coupled to the signal input of the sixth of the six switches.

7. The write driver of claim 6, wherein the six switches of the bit cell are field effect transistors (FETs).

8. The write driver of claim 6, wherein the FETs of the bit cell are metal oxide semiconductor FETs (MOSFETs).

9. The write driver of claim 6, wherein the first and third fifth of the six switches of the bit cell are p-channel metal oxide semiconductor field effect transistors (MOSFETs).

10. The write driver of claim 9, wherein the second, fourth, fifth and sixth of the six switches of the bit cell are n-channel MOSFETs.

11. A negative bit line write assist circuit, comprising:
   a) a write assist clock port;
   b) a write input port;
   c) a write complement input port;
   d) a write assist output port;
   e) a write output port;
   f) a write assist complement output port;
   g) a write complement output port;
   h) a delay device having an input, a first output and a second output;
   i) a capacitive element having a first port and a second port;
   j) seven switches, each having a signal input, signal output and control input,
      i) the signal input of a first of the seven switches coupled to (1) the second port of the capacitive element, (2) the signal input of a second of the seven switches and (3) the signal input of a third of the seven switches,
      ii) the control input of the first of the seven switches coupled to the input of the delay device and to the write assist clock port;
      iii) the control input of a second of the seven switches coupled to the write input port and to the signal input of a fourth of the seven switches;
      iv) the control input of the fourth of the seven switches coupled to (1) the control input of a fifth of the seven switches, (2) the control input of a sixth of the seven switches, (3) the control input of a seven of the seven switches and to (4) the first output of the delay device;
      v) the signal input of the second of the seven switches coupled to the signal output of the fourth of the seven switches and to the write assist output port;
      vi) the negative power supply port coupled to the signal output of the second of the seven switches and to the signal output of the first of the seven switches and to signal output of the seventh of the seven switches;
      vii) the signal input of the seventh of the seven switches coupled to the write assist complement output port and to the output of the sixth of the seven switches;
      viii) the signal output of the second of the seven switches coupled to the write output port;
      ix) the signal output of the third of the seven switches coupled to the write complement output port; and
      x) the control input of the third of the seven switches coupled to the signal input of the sixth of the seven switches and to the write complement input port.

12. The negative bit line write assist circuit of claim 11, wherein the first, second, third, fifth, and seventh switches are field effect transistors (FETs).

13. The negative bit line write assist circuit of claim 11, wherein the FETs are metal oxide semiconductor FETs (MOSFETs).

14. The negative bit line write assist circuit of claim 11, wherein the first, second, third, fifth, and seventh switches are n-channel metal oxide semiconductor field effect transistors (MOSFETs).

15. The negative bit line write assist circuit of claim 11, wherein the delay device comprises at least two inverters coupled in series.

16. The negative bit line write assist circuit of claim 11, wherein the capacitive device is a MOSCAP.

17. The write driver of claim 16, wherein the MOSCAP is a MOSFET having a drain and source coupled together.

* * * * *